United States Patent
Rinn

(10) Patent No.: US 7,823,295 B2
(45) Date of Patent: Nov. 2, 2010

(54) METHOD FOR CALIBRATION OF A MEASURING TABLE OF A COORDINATE MEASURING MACHINE

(75) Inventor: Klaus Rinn, Heuchelheim (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 0 days.

(21) Appl. No.: 12/690,489

(22) Filed: Jan. 20, 2010

(65) Prior Publication Data
US 2010/0205815 A1    Aug. 19, 2010

(30) Foreign Application Priority Data
Feb. 18, 2009    (DE)    ........................ 10 2009 003 503

(51) Int. Cl.
G01B 5/008    (2006.01)
G01B 1/00    (2006.01)
(52) U.S. Cl. .......................................... 33/502; 33/503
(58) Field of Classification Search ........... 33/503–504, 33/1 M, 702, 706, 549, 551
See application file for complete search history.

(56) References Cited

U.S. PATENT DOCUMENTS

| | | | |
|---|---|---|---|
| 4,583,298 A | 4/1986 | Raugh | |
| 5,798,947 A * | 8/1998 | Ye et al. | ........................ 702/95 |
| 6,317,991 B1 | 11/2001 | Rinn | |
| 6,366,866 B1 * | 4/2002 | Kanagawa et al. | ............ 702/95 |
| 6,948,254 B2 * | 9/2005 | Stiblert et al. | .................. 33/502 |
| 7,420,670 B2 | 9/2008 | Rinn et al. | |
| 7,694,426 B2 * | 4/2010 | Heiden et al. | .................. 33/503 |
| 7,765,079 B2 * | 7/2010 | Nara et al. | ..................... 702/94 |
| 2003/0106229 A1 * | 6/2003 | Jordil et al. | ..................... 33/502 |
| 2005/0086820 A1 * | 4/2005 | Stiblert et al. | .................. 33/502 |
| 2009/0002486 A1 * | 1/2009 | Fricke et al. | .................. 348/95 |
| 2009/0024344 A1 * | 1/2009 | Heiden et al. | .................. 702/95 |
| 2009/0271996 A1 * | 11/2009 | Ferrari et al. | .................. 33/502 |

FOREIGN PATENT DOCUMENTS

DE    19734695 C1    11/1998
DE    102004023739 A1    12/2005

* cited by examiner

Primary Examiner—Yaritza Guadalupe-McCall
(74) Attorney, Agent, or Firm—Houston Eliseeva, LLP

(57) ABSTRACT

A method is disclosed which is suitable for the calibration of a measuring table (20) of a coordinate measuring machine (1). For this purpose, a mask (2) is deposited in a three-point support of the measuring table (20), wherein the mask (2) used for the calibration of the measuring table (20) is a mask (2), which is used for the semiconductor production. The measurement of positions of a plurality of different structures (3) which are arranged in a distributed manner on the mask (2) is carried out. The structures (3) are available in an initial orientation on the mask (2). The mask (2) is rotated and the position of the structures (3) is determined in the rotated orientation. Afterwards, the mask (2) is shifted and the position of the structures (3) is also determined. A total correction function for eliminating coordinate-dependant measuring errors is determined, wherein the total correction function has a first correction function and a second correction function.

8 Claims, 5 Drawing Sheets

METHOD FOR CALIBRATION OF A MEASURING TABLE OF A COORDINATE MEASURING MACHINE

RELATED APPLICATIONS

This application claims priority to German Patent Application No. 10 2009 003 503.6, filed on Feb. 18, 2009, which is incorporated herein by reference in its entirety.

FIELD OF THE INVENTION

The present invention relates to a method for calibration of a measuring table of a coordinate measuring machine.

BACKGROUND OF THE INVENTION

German Patent DE 197 34 695 C1 discloses a method for the correction of measuring errors of a coordinate measuring machine. A method for the self-calibration of the coordinate measuring machine is disclosed. Thereby, the coordinates of structures on a non calibrated reference object are measured in several rotational positions on the object table of the coordinate measuring machine. The measured coordinates are rotated back with rotating functions into the initial position. Thereby, a correction function is determined such that the coordinates rotated back have an optimal accordance with the coordinates of the initial orientation. Thereby, each reference object is rotated about only one angle. Rotation symmetrical linear combinations of the fit functions consulted to the approximation of the correction function are determined and waived during approximation. The generated correction functions are systematically complete and do not contain any indefinite or faulty terms.

High-precision coordinate measuring machines are used in the semiconductor industry for measuring structures on masks or wafers. The exact knowledge of the coordinates of the structures on masks is mandatorily necessary in order to conduct a controlled production of integrated circuits.

The measuring parameters of these high-precision coordinate measuring machines have error components which are dependant from the place of measuring that is the measured coordinate. Thereby, systematic error components exist, which result from the construction and the choice of the assembly parts of the coordinate measuring machine. Thus, for example known errors are to be found in the mirror orthogonality and the mirror planarity, in distortions in the scaling of the measuring axes (so called cosines errors) as well as in the deflection of the mask used for correction.

For reaching high-precision of the measurements, high-precision coordinate measuring machines need coordinate-dependant error correction. The determination of this correction is generally obtained by comparison with a standard. As for extremely high precisions which prevail for example in the measuring technique of semiconductor substrates, no adequate exact standard yet exists. Instead it is known to calibrate a coordinate measuring machine with itself by measuring one and the same object in several positions. With an error correction function generated by self-calibration all errors of the coordinate measuring machine are detected except for the scaling error. This scaling error can be detected only by comparison with a suitable length standard.

U.S. Pat. No. 4,583,298 describes the self-calibration of a coordinate measuring machine with a so called calibration plate onto which a grid is arranged. However the positions of the grid points are not calibrated. The grid plate is positioned onto the object table of the coordinate measuring machine and the positions of the grid points are measured. The same grid line is then being further rotated two or more times about 90° in each case about a rotation axis and the positions of the grid points are measured in each of the adjusted orientations. The measuring results are mathematically rotated back and different correction factors and tables optimized such that the data being rotated back is provided with a better accordance.

U.S. Pat. No. 4,583,298 deals in detail with the problems of faulty and unreliable corrections. Errors during the measurement of the measuring parameters consulted for the correction determination are determined as the source. It is shown that a mathematically definite correction is obtained only if more than two different rotational positions are measured with the same grid plate, and the rotational centers for the rotations between the rotational positions are thereby sufficiently different. For this purpose, the grid plate is positioned, as known, on the object table and the positions of its grid points are measured in several orientations of the grid plate. The orientations are obtained for example by several rotations of 90° about its center point. Afterwards, the grid plate has to be shifted, however, to a completely different position on the object table. There, the measurement of the position of its grid points is repeated in several orientations, as already mentioned beforehand. Thereby it is essential that the same grid plate must be shifted on the object table.

However, this requirement turns out to be not advantageous in practice, since the simplest way is to rotate the grid plate about such angles at which the outer dimensions merge. Thereby, the rotating point is always the center point of the grid plate. Thus, in U.S. Pat. No. 4,583,298 a square calibration plate is for example inserted in a square frame and positioned after each measurement shifted about 90° in said frame again. Therewith, all rotational centers are equal to the center point of the calibration plate. Only if the rotational centers are far apart that is if their spacings are akin to the spacings of the calibration structures, the error correction is better. But even if considerably different rotational centers are realized, the obtained correction factors as well as the correction result are not entirely satisfying.

In order to allow a significantly shift of the rotational centers, the holding mechanism such as the square frame must be shifted. For this purpose, also the measuring table must be enlarged in comparison with the not shifted object. The actions necessary for this conversion of the coordinate measuring machine are associated with significant drawbacks. Thus, a mounting of a shiftable holding frame for the calibration plate on the object table is problematic. If namely several mask holders are available on the object table (such as vacuum chuck or special more-point mounting), they would have to be mounted extra for the calibration measurement. The positioning of a holding frame on available mask holders is also out of question since they could be damaged and provide no plane positioning surface for the holding frame respectively.

Likewise, the enlargement of the measurement area for the measurement of the calibration plate in a shifted condition is problematic. Said enlargement requires cost intensive and constructive changes which are integrated into the production costs of the coordinate measuring machine. The overall dimensions of the coordinate measuring machine are also enlarged. However, the positioning area of the coordinate measuring machine affects directly the operating costs since the positioning area in the clean room is very expensive in the semiconductor industry.

U.S. Pat. No. 5,798,947 discloses a method, an apparatus and a computer program for self-calibrating two-dimensional tables for metrology. For this purpose, a rigid substrate is used, which has features on a regular grid in order to calibrate each of the two-dimensional table positions with respect to a coordinate system. A distortion function should in each case be determined for the X coordinate direction and the Y coordinate direction from the calibration. Thereby, each of the two-dimensional table positions of an array of table positions is connected to a Cartesian coordinate system in order to determine the distortions. Firstly, a substrate having a plurality of marks is positioned on the measuring table. The marks on the substrate are thereby spaced regularly from each other. Afterwards, each position of each mark is measured on the substrate. The substrate is thereby kept in an outlet reference position on the table. When this measurement is completed, the substrate is rotated about the reference position so that the substrate is transferred into a rotated reference position. Finally, the positions of the marks are measured on the substrate wherein the substrate is kept in the rotated reference position. A complete, non-four-fold rotationally symmetric distortion between the two-dimensional array of table positions and the Cartesian coordinate grid from the measured positions of the marks is determined in the original and the rotated reference position. The substrate is shifted about at least one interval (grid spacing of the marks) relatively to the original reference position. Therewith, the substrate is transferred into a shifted reference position. Afterwards, the positions of the marks on the substrate are measured, wherein the substrate is kept in the shifted reference position. An incomplete, non-four-fold rotationally symmetric distortion between the two-dimensional array of table positions and the Cartesian coordinate grid from the measured positions of the marks is determined in the original and the rotated reference position. Finally, a two-dimensional shifting error and a two-dimensional rotation error are determined from the complete, non-four-fold rotationally symmetric distortion and the incomplete, non-four-fold rotationally symmetric distortion. Likewise, a complete, non-four-fold rotationally symmetric distortion between the two-dimensional array of table positions and the Cartesian coordinate grid from the shifting errors and rotation errors, and the measured position of the marks is determined in the original, the rotated and the shifted reference position.

In the method disclosed in U.S. Pat. No. 5,798,947, special masks are used onto which the marks to be measured are arranged in a regular grid in the X and Y plane.

A coordinate measuring device and a method are known from the published patent application DE 10 2004 023 739. Thereby, a mask is also arranged on a measuring table which is shiftable into X coordinate direction and Y coordinate direction. A focusing optic and a detector are furthermore provided. The mask can be illuminated with a reflected light illumination device and/or a transmitted light illumination device so that the structure to be measured is imaged onto the detector.

SUMMARY OF THE INVENTION

Thus, the object of the invention is to create a method for calibrating a measuring table of a coordinate measuring machine which enables the reliable calibration of the coordinate measuring machine without major conversions and the usage of special masks.

This object is achieved according to the invention by a method for calibration of a measuring table of a coordinate measuring machine, comprising the following steps:

positioning a mask in a three-point support of the measuring table, wherein the mask used for the calibration of the measuring table is a mask which is used for the production of semiconductors and has a plurality of structures on a surface;

measuring positions of a plurality of different structures in an initial orientation of the mask, wherein the structures are distributed on the mask;

rotating the mask about an angle and measuring the same plurality of different structures in a rotated orientation of the mask;

shifting the mask by any parameter in a X-coordinate direction and a Y-coordinate direction and measuring the same plurality of different structures distributed on the mask in a shifted position of the mask; and determining an overall correction function for eliminating coordinate-dependant measuring errors, wherein the overall correction function has a first correction function and a second correction function, rotating back the measuring parameters of the structures of the mask obtained in the rotated orientation by the first correction function onto the measuring parameters of the structures obtained in the initial orientation and shifting back the measuring parameters of the structures of the mask obtained in the shifted position by the second correction function onto the measuring parameters of the structures obtained in the rotated orientation.

For conducting the calibration of a measuring table of a coordinate measuring machine the mask is firstly positioned in a three-point support of the measuring table. The mask used for the calibration of the measuring table is a mask which is also used for the production of semiconductors and thus has a plurality of structures on the surface. Said structures are imaged with a projection process reduced onto the surface of a wafer in order to form there the respective structures for the production of circuits on the wafer in a photo resist. Then a plurality of positions of structures distributed on the mask is determined for the calibration in an initial orientation of the mask. Finally, the mask is rotated about a certain angle and the same plurality of marks on the surface of the mask is measured in the rotated orientation. Finally, the mask is shifted by any parameter and also the same plurality of different structures distributed on the mask measured in the shifted position of the mask. An overall correction function for eliminating coordinate-dependant measuring errors is determined from the measured positioning data of the different marks in the different orientations and positions of the mask respectively. The correction function has a first correction function and a second correction function. The first correction function results from the measuring parameters of the positions of the structures on the mask in the rotated orientation, wherein the obtained measuring parameters of the structures on the mask are rotated back onto the measuring parameters of the structures obtained in the initial orientation. The second correction function returns the measuring parameters of the structures of the mask obtained in the different positions back to the measuring parameters of the structures of the mask obtained in the rotated orientation.

The mask can be positioned with a handler of the coordinate measuring machine in the initial orientation, the rotated orientation and the shifted position on the measuring table of the mask.

The measuring table is a mirror element which has three supporting points for the mask. Thereby, the mask is positioned in a controlled manner by the handler in the orientation or shift determined by the coordinate measuring machine onto the three supporting points of the mirror element.

In a further embodiment, the mirror element is also provided with three supporting points onto which a mask holder can be positioned. The mask holder itself has three supporting points for the mask onto which the mask is positioned in a defined manner. The mask holder is positioned together with the mask, wherein said mask holder is controlled by the handler in the orientation or shift determined by the coordinate measuring machine on the three supporting points of the mirror element.

The plurality of different structures to be measured and distributed on the mask is chosen in such a way that the plurality of the structures to be measured is more or less equally distributed within an effective area of the mask without the existence of a same spacing between the individual structures to be measured in X-coordinate direction and/or Y-coordinate direction.

The handler is controlled such that the mask comes to rest on the measuring table in any orientation and/or any shift with reference to a coordinate system of the coordinate measuring machine.

The coordinate measuring machine has a measurement table which is movable in a plane. The measurement table is designed such that the masks can be moved in a respective manner in the plane. Furthermore, an illumination and imaging device is provided, wherein the imaging device has at least one objective and one detector. The illumination device has a light source with a reflected light beam path and/or a light source in a transmitted light beam path.

From the mathematical point of view, a correction function for eliminating coordinate-dependant measuring errors of a coordinate measuring machine, wherein said correction function is dependant from the measuring place, is a two-dimensional or three-dimensional correction function. The correction function is always constant and differential in practice. By applying this correction function onto a measured faulty coordinate F (the position vector is meant) of a structure of any measuring object, the related corrected coordinate $\vec{r}_{Korr} = \vec{r} + \text{correction\_function}$ is obtained.

For determining the correction function said correction function is approximated by a series development of a term of given fit functions.

For determining the correction function, the fit parameters must therefore be determined to the fit functions so that the correction is optimal, i.e. the remaining error would be minimal or nil.

So, there are special correction function components, which cannot be definitely determined or which are flawed with major errors. In this connection these are predominantly components, which always merge into themselves (exactly or approximately only) during the calibration measurements of all orientations of a reference object used for calibration, i.e. the rotation-symmetrical components are invariant for the conducted rotations of the reference object. It is in each case a linear combination of fit functions which are rotation-symmetrical as a whole with reference to all conducted rotations.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
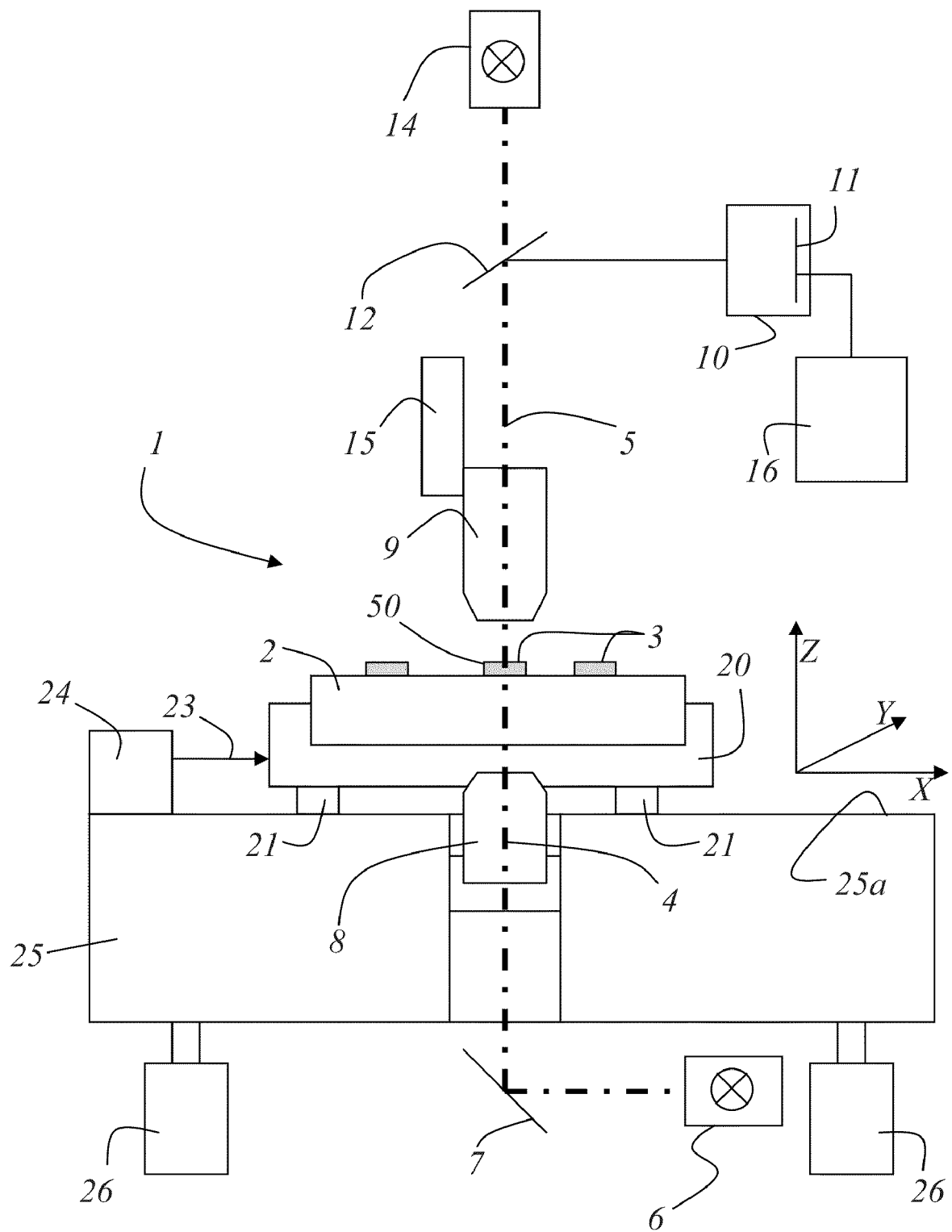
FIG. 1 schematically shows a coordinate measuring machine with which the calibration of the measuring table of the coordinate measuring machine is carried out.

FIG. 1 schematically shows a coordinate measuring machine 1, as it is used according to the method according to the invention. The coordinate measuring machine has a measuring table 20, which carries a mask 2. Likewise it is possible that the measuring table 20 carries a mask 2, which is inserted in a mask holder 2b. The measuring table 20 is a mirror element, wherein the position of the measuring table 20 is determined via a respectively arranged laser interferometer system 24. The measuring table 20 is movable on bearings 21 in X coordinate direction and in Y coordinate direction. In a preferred embodiment, the bearings 21 are designed as air bearings. The measuring table 20 rests on a block 25, which defines a plane 25a. The block 25 is preferably made of granite. The position of the measuring table 20 is determined, as already mentioned, by the laser interferometer system 24. For this purpose, the laser interferometer system 24 emits a measuring light beam. The block 25 is positioned on vibration absorbers 26. It is obvious for a skilled person that the provided plane 25a, in which the measuring 20 can be moved, can be made from any other material. The block 25 being made of granite shall be regarded by no means as limiting the invention.

The mask 2 carries a plurality of structures 3, which are to be measured due to the position with reference to a coordinate system. A light source 14 in the reflected light beam path or a light source 14 in the transmitted light beam path is provided for illuminating the mask 2. The light source 14 in the reflected light device emits light into the reflected light beam path 5. The light source 6 in the transmitted light device emits light into a transmitted light beam path 4. Light from the transmitted light device is directed by a condenser 8 onto the mask 2. The light from the light source 14 of the reflected light device reaches the mask 2 via the measuring objective 9. The measuring objective 9 is arranged in a shiftable manner with a shifting device 15 in Z coordinate direction for focusing. The reflected light beam path 5 is furthermore provided with a decoupling device 12 which channels the light emitted from the mask 2 and cumulated from the objective 9 onto a camera 10, wherein said camera 10 has a detector 11. The detector 11 is connected with a computer which determines an intensity profile of the structure 3 just being observed by the measuring objective 9 from the received signals. With the measuring intensity profile it is possible to determine the position of at least one edge of the structure with reference to a coordinate system.

Figure 2:
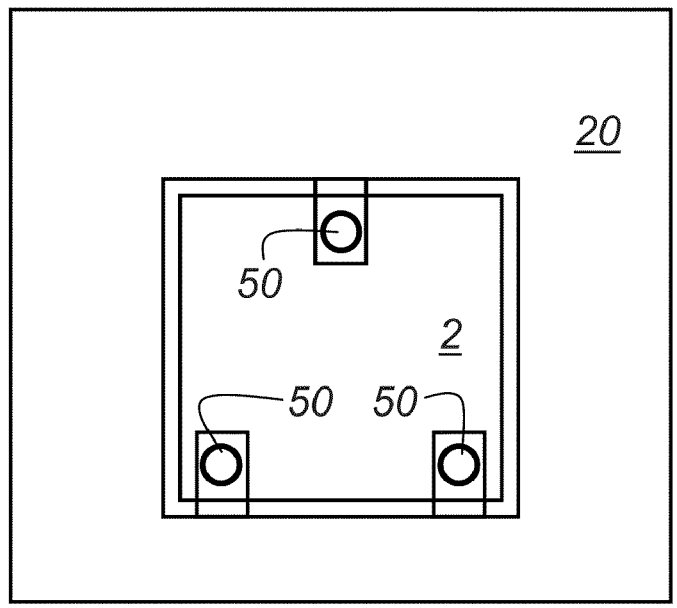
FIG. 2 schematically shows a mask which is positioned on the measuring table on three supports and supporting points respectively.

FIG. 2 shows a schematic view wherein a mask 2 is inserted in a measuring table 20. Thereby the mask 2 rests onto three supporting points 50. The supporting points 50 are mounted on the measuring table 20.

Figure 3:
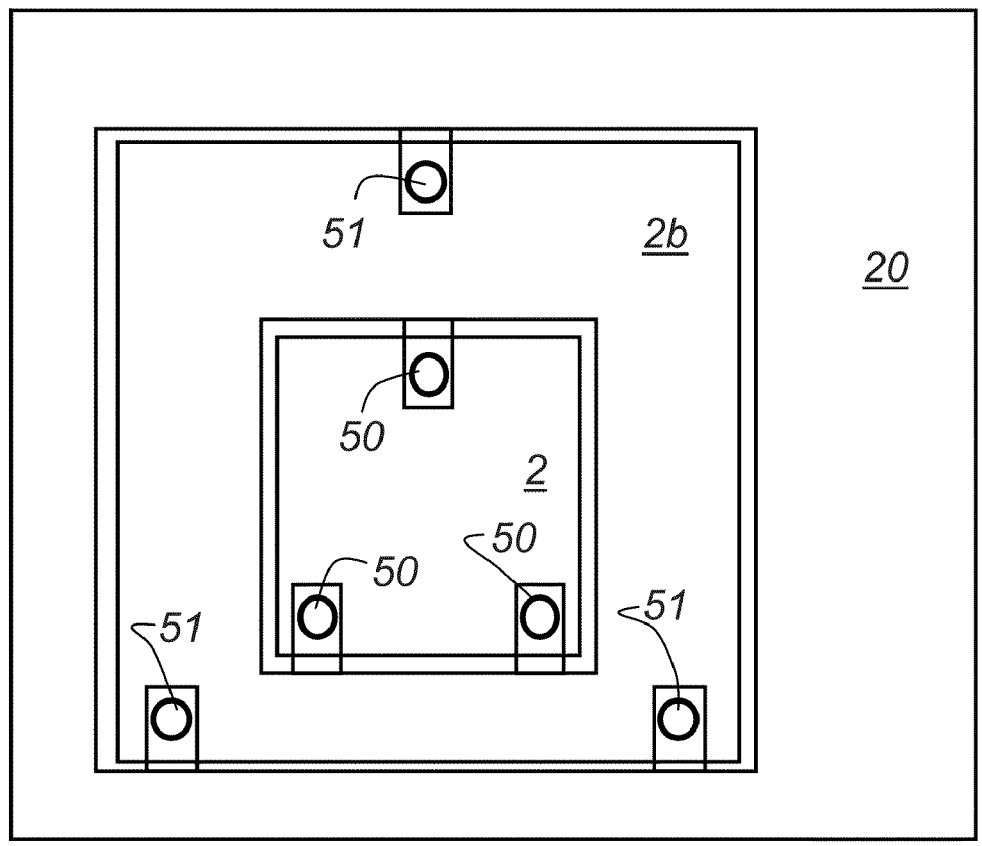
FIG. 3 schematically shows a mask, which is positioned in a mask holder on three supporting points and wherein this mask holder in turn rests on three supporting points on the measuring table.

According to a further embodiment (see FIG. 3), the mask 2 is inserted in a mask holder 2b. This mask holder 2b is finally inserted in the measuring table 20. Thereby, the mask holder 2b rests on the two supporting points, which are provided on the measuring table 20. The mask holder 2b has three supporting points 51, onto which the mask 2 rests.

Figure 4:
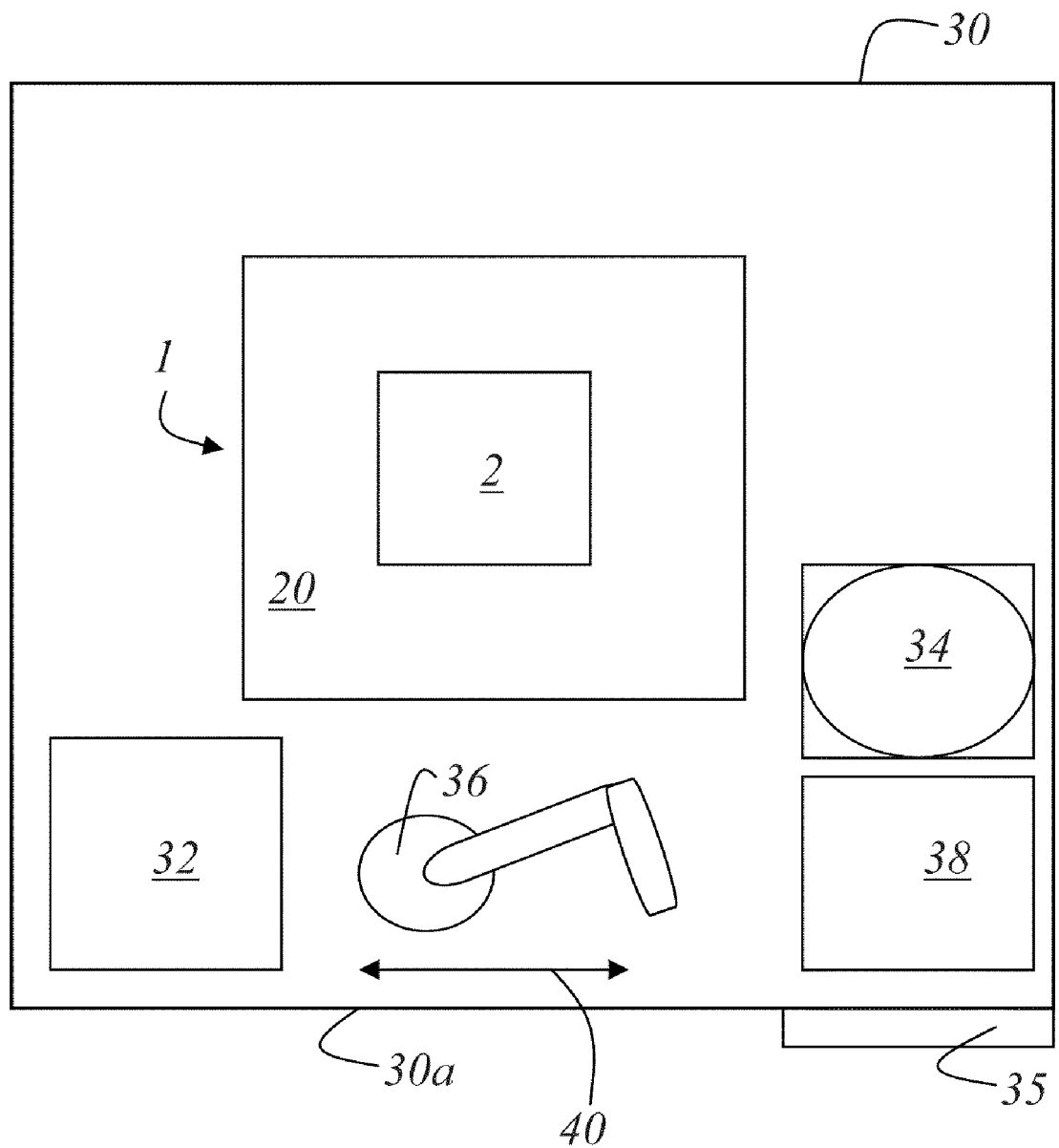
FIG. 4 schematically shows the construction of a system which comprises a coordinate measuring machine and several other devices, which are responsible for the orientation adjustment of the mask and the mask holder respectively.

FIG. 4 shows a system 30, which has further elements besides a coordinate measuring machine 1, wherein the elements are used for handling the mask 2 and for the positioning of the mask 2 in the coordinate measuring machine 1. Thereby, the coordinate measuring machine 1 and the further additional elements are arranged in a housing 30. The coordinate measuring machine 1 is very schematically shown for the sake of clarity, so that only the measuring table 20 and the mask 2 positioned on the measuring table 20 are provided here. The coordinate measuring machine 1 is provided within the housing 30 with a tempering station 32, a rotator 34 and a transfer station 38. Likewise, a transport robot 36 (handler) is provided within the housing 30, wherein said transport robot 36 (handler) is moved along the double arrow 40. The transport robot 36 is responsible for transporting the mask 2 to the different stations and from and to the coordinate measuring machine 1 respectively. Likewise, the transport robot 36 is responsible for positioning the mask 2 in the orientation adjusted with the rotator 34 or positioning a mask 2 which rests in the mask holder 2b in the orientation thus positioned onto the measuring table 20 of the coordinate measuring machine 1. Likewise, the transport robot 36 is responsible for positioning the mask 2 with a respective predefined shift on the measuring table 20 of the coordinate measuring machine 1. Furthermore, at least on one housing wall 30a a transfer opening 35 is provided through which masks 2 can be inserted from the outside into the housing 30 of the coordinate measuring machine 1. The housing 30 is a climate chamber. This is advantageous since generally no tempering times need to be adhered to when handling the masks 2 within the housing 30. The masks 2 can thus be immediately measured with the coordinate measuring machine 1 apart from a minor temperature adjustment.

Figure 5A:
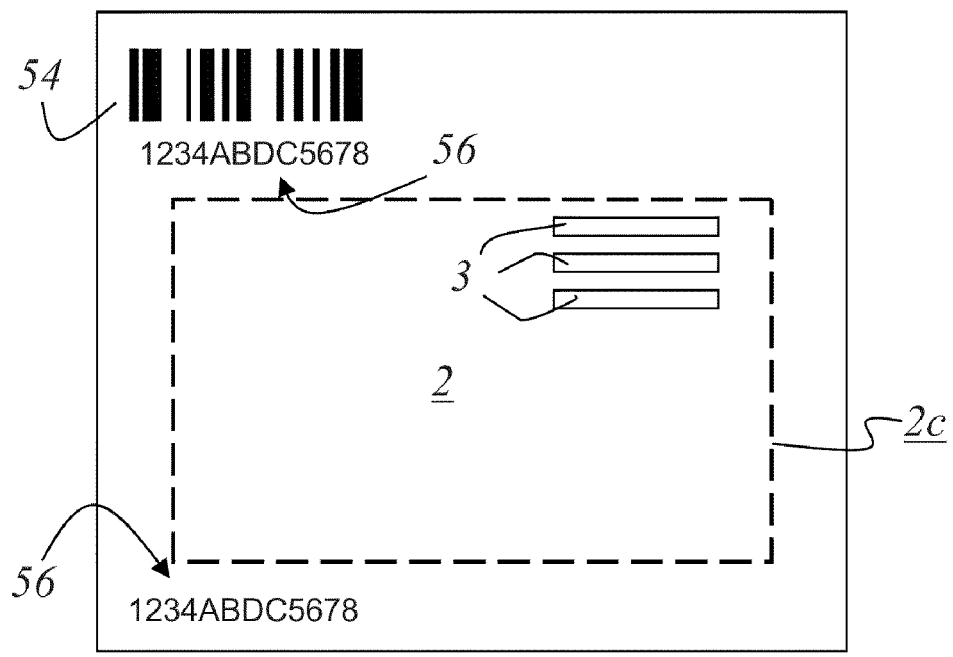
FIG. 5a schematically shows a mask in an outlet orientation.

FIG. 5a shows a mask 2 in an initial orientation. Thereby, the mask 2 can have a relevant area 2c, which is responsible for imaging the structures on the surface of a wafer. The plurality of structures 3 is arranged in this relevant area 2c. Likewise, a marking in form of a bar code 54 can be provided on the surface of the mask 2. It is also possible that an alpha numeric marking 56 is on the mask 2.

Figure 5B:
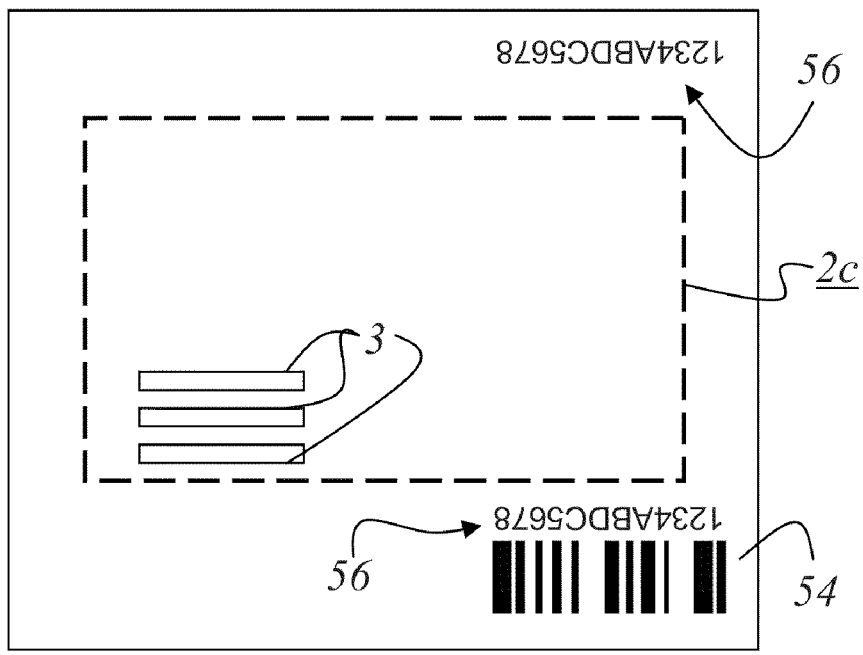
FIG. 5b schematically shows the mask in another adjusted orientation.

FIG. 5b shows the mask 2 in a rotated orientation by 180°. On the basis of the alpha numeric marking 56 or also on the basis of the bar code 54 the set orientation of the mask 2 can thus be determined.

Figure 6:
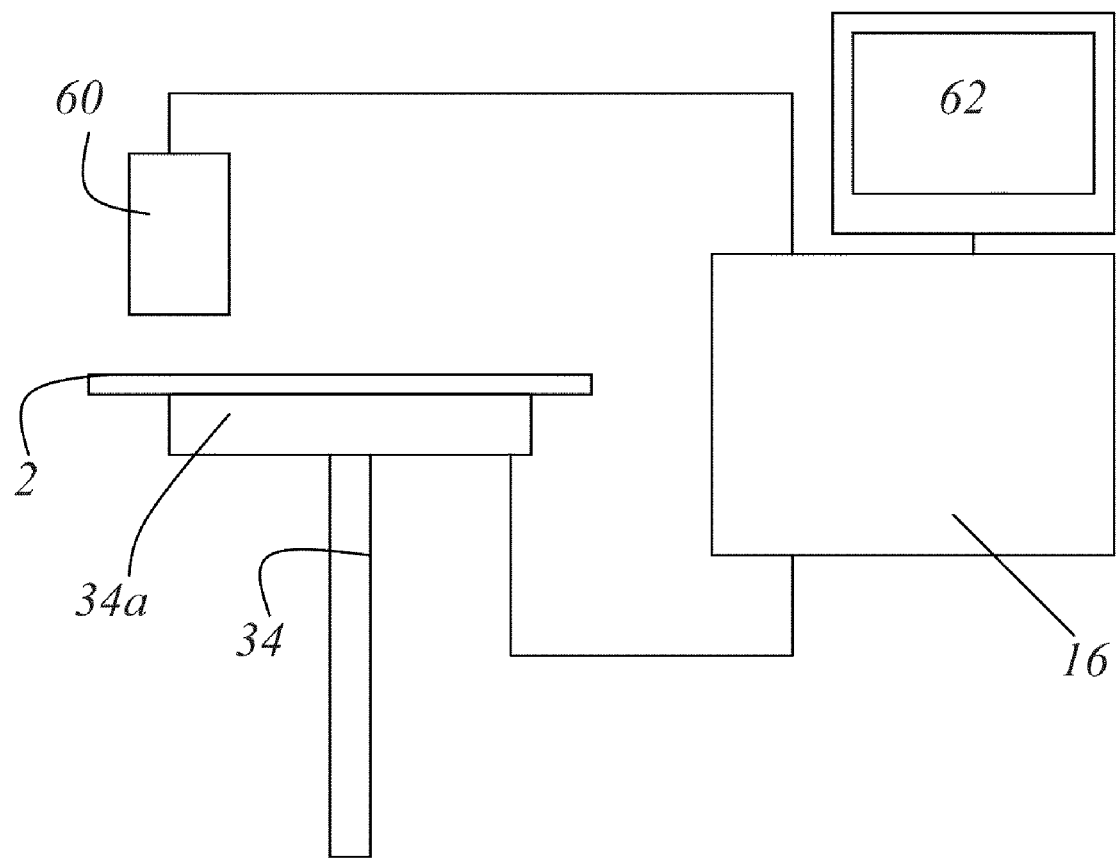
FIG. 6 schematically shows a device, which is assigned to the system of the coordinate measuring machine, in order to determine and to check respectively the adjusted orientation of the mask.

FIG. 6 schematically shows an arrangement with which the orientation of a mask 2 can be determined and controlled respectively. The rotator 34 is provided with a camera 60 in the embodiment shown here. The rotator 34 has a rotating plate 34a onto which the mask 2 and the mask holder 2b with the mask 2 respectively are positioned. The orientation necessary for calibration can be adjusted via the rotator 34. The respective markings (bar code 54 or the alpha numeric marking 56) can be detected on the mask 2 with the camera 60. On the basis of this detection, the afterwards set orientation of the mask 2 can be detected. The data recorded with the camera 60 are evaluated with the computer 16, which finally determines the rotating position of the mask 2 depending on the X position and the Y position on the basis of the recorded measuring parameters. Furthermore, the computer 16 can have a display 62 onto which the relevant data are shown to a user. Likewise, the data of the orientation of the mask 2, which were set by the rotator 34, can be transferred to the transport robot 36, so that said transport robot 36 positions the mask 2 in the respective adjusted orientation on the measuring table 20. Likewise, the shift of the mask 2, which is necessary for the calibration, can be set via the computer 16, so that the transport robot 36 positions the mask 2 with the required shift on the measuring table 20.

The thought behind the improved correction strategies always is the one that error components exist which merge into themselves for the measured substrate positions (rotation and/or shift) and thus are generally not detectable. Such error components are not avoidable in principle yet it is possible, however, to reduce those highly so that these error components do not occur in a real arrangement. More precisely, these error components are to be regarded then as insignificant.

During correction, the correction functions are applied on the measuring parameters, wherein the measuring parameters are the positions of the structures on a substrate or a mark with reference to the coordinate system of the coordinate measuring machine. A not corrected position ($\vec{r}$) becomes a position with improved accuracy:

$$\vec{R} = \vec{i} + \vec{r}(\vec{r}) \quad (1)$$

The correction function is determined such that the back transformations $\hat{T}_{jk}$ from the substrate positioning j to k supplies possibly corresponding parameters, i.e.:

$$\vec{R}_k \approx \hat{T}_{jk}(\vec{R}_j) \quad (2)$$

Possibly corresponding could be interpreted for example within the meaning of the Gaussian least square error, thus $$\sum_i (\vec{R}_{ki} - \hat{T}_{jk}(\vec{R}_{ji}))^2 = \min$$

Thereby, the index i refers to the measurement of the measuring object (structure) i. A reduction of the maximum difference is also possible, however. Likewise, other methods, preferably robust estimation procedures such as RANSAC are possible.

A substrate having structures, on the basis of which the substrate shall be measured, is a rigid object, a mask for the production of semiconductor structures on a wafer, (at least calculated rigid for example by deflection correction). Thus the matter with the back transformation is rotation and shift:

$$\hat{T}_{jk}(\vec{R}) = \hat{R}_{jk} \cdot \vec{R} + \vec{\Delta}_{jk} \text{ with: rotation } \hat{R}_{jk} \text{ and shifted by}$$
$$\vec{\Delta}_{jk} \quad (3)$$

The equation (2) refers to corrected measuring parameters; said equation (2) can be rewritten by the equations (1) and (3) into:

$$\vec{r}_k + \vec{f}(\vec{r}_k) \approx \hat{R}_{jk} \cdot (\vec{r}_j + \vec{f}(\vec{r}_j)) + \vec{\Delta}_{jk} \Leftrightarrow \vec{r}_k + \vec{f}(\vec{r}_k) \approx$$
$$\hat{R}_{jk} \cdot \vec{r}_j + \hat{R}_{jk} \cdot \vec{f}(\vec{r}_j) + \vec{\Delta}_{jk} \quad (4)$$

Lets consider the case that a portion of the correction function under $\hat{T}_{jk}(\vec{f}(\vec{r}))$ merges into itself, i.e. the request for translations invariance of a function combined:

$$\vec{f}(\vec{r}) = \vec{f}(\vec{r} + \vec{\Delta})$$

with the rotation invariance:

$$\hat{R} \cdot \vec{f}(\vec{r}) = \vec{f}(\hat{R} \cdot \vec{r})$$

and therewith, a symmetrical function is defined as:

$$\hat{R} \cdot \vec{f}_{sym}(\vec{r}) = \vec{f}_{sym}(\hat{R} \cdot \vec{r} + \vec{\Delta}_{jk}) \quad (5)$$

Typical substrate dimensions (mask sizes) are 100 mm on 100 mm, and the typical dimension of the correction is 1 μm. One can experience always under 10 000 measurements on the substrate, thus the typical distance of the measuring positions is always >1 mm or the thousand times of the correction parameter. Thus, the parameters of a practically determinable correction function are always very much smaller than the distance of the measuring positions, so that the following assumption is just:

$$f(\vec{r}) \approx f(\vec{R}) \quad (6)$$

thus with (2) one can write:

$$f(\vec{r}_k) \approx f(\vec{R}_k) = f(\hat{T}_{jk}(\vec{R}_j)) \approx f(\hat{T}_{jk}(\vec{r}_j)) = f(\hat{R}_{jk} \cdot \vec{r}_j + \vec{\Delta}_{jk})$$
$$\Leftrightarrow f(\vec{r}_k) \approx f(\hat{R}_{jk} \cdot \vec{r}_j + \vec{\Delta}_{jk})$$

Thus, the final equation for determining the correction (4) can be written as:

$$\vec{r}_k + \vec{f}(\vec{r}_k) \approx \vec{r}_k + f(\hat{R}_{jk} \cdot \vec{r}_j + \vec{\Delta}_{jk}) \approx \hat{R}_{jk} \cdot \vec{r}_j + \hat{R}_{jk} \cdot \vec{f}(\vec{r}_j) +$$
$$\vec{\Delta}_{jk}$$

If any symmetrical function $\vec{f}_{sym}$ (see equation (5)) is added to the correction function, the equation can be written as:

$$\vec{r}_k + \vec{f}(\hat{R}_{jk} \cdot \vec{r}_j + \vec{\Delta}_{jk}) + \underbrace{\vec{f}_{sym}(\hat{R}_{jk} \cdot \vec{r}_j + \vec{\Delta}_{jk})}_{\hat{R}_{jk} \cdot \vec{f}_{sym}(\vec{r}_j)} \approx$$

$$\hat{R}_{jk} \cdot \vec{r}_j + \hat{R}_{jk} \cdot \vec{f}(\vec{r}_j) + \hat{R}_{jk} \cdot \vec{f}_{sym}(\vec{r}_j) + \vec{\Delta}_{jk} \Leftrightarrow$$

$$\vec{r}_k + \vec{f}(\hat{R}_{jk} \cdot \vec{r}_j + \vec{\Delta}_{jk}) \approx \hat{R}_{jk} \cdot \vec{r}_j + \hat{R}_{jk} \cdot \vec{f}(\vec{r}_j) + \vec{\Delta}_{jk}$$

Thus, if one adds a function which is symmetrical for a respective rotation and translation, to the correction, then accordance of the substrate positions does not change. Thus, such a correction component is generally not determinable.

The obviously not detectable error component is the enlargement ("errors during meter definition"). It is described by the following function:

$$\vec{f}_0(\vec{r}) = a \cdot \vec{r}$$

$f_0$ is symmetrical for any rotations and shifts and thus (naturally) not determinable.

With a correction determination, the indeterminable components must be symmetrical to all transformations between the substrate positions. In prior art documents one tried to limit the symmetrical correction function components by letting the substrates rotate about different rotating centers (see German patent application DE 10 2007 000 999 A1). According to the present invention one tries to minimize the symmetry by rotation plus shift. From the mathematical point of view all symmetry components except for $f_o$ can thus be relatively easily find out. The practical limitation is however:

that the hardware of the coordinate measuring machine is able to realize rotation positions being no multiple of 90°, wherein a great deal of time and effort is expended.

with the finite measuring accuracy, an approximate symmetry is already adequate in order to make it possible carrying out the determination of the symmetric correction components with major errors only. The unavoidable shift and rotation during the mechanical positioning of a substrate on the measuring table of the coordinate measuring machine is typical for such an error. This does not solve the symmetry problem, since the correction function remains practically unchanged with minor positioning changes (see explanation for equation (6)).

A correction could be carried out as follows:

Firstly, the substrate is measured in the not rotated position (measurement in 0°);

Afterwards the substrate is rotated by 90° and measured in the rotated position (measurement in 90°);

Then a shift by 10 mm in X coordinate direction and a shift by 9 mm in Y coordinate direction is carried out.

By means of the first two steps all not 90° symmetrically rotatable components can be detected. The shift by 10 mm in X coordinate direction reduces the undeterminable components to 90° symmetrically rotatable periodical components with period lengths of 10 mm/n with n=1, 2, 3, and the shift by 9 mm in Y coordinate direction furthermore limits to 9 mm/m with m=1, 2, 3. Thus, only the component with period 1 mm (i.e. n=10 and m=9) is undetectable.

Further shifts and rotations do improve the quality of the correction even more.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for calibration of a measuring table of a coordinate measuring machine, comprising the following steps:

positioning a mask in a three-point support of the measuring table, wherein the mask used for the calibration of the measuring table is a mask which is used for the production of semiconductors and has a plurality of structures on a surface;

measuring positions of a plurality of different structures in an initial orientation of the mask, wherein the structures are distributed on the mask;

rotating the mask about an angle and measuring the same plurality of different structures in a rotated orientation of the mask;

shifting the mask by any parameter in a X-coordinate direction and a Y-coordinate direction and measuring the same plurality of different structures distributed on the mask in a shifted position of the mask; and determining an overall correction function for eliminating coordinate-dependant measuring errors, wherein the overall correction function has a first correction function and a second correction function, rotating back the measuring parameters of the structures of the mask obtained in the rotated orientation by the first correction function onto the measuring parameters of the structures obtained in the initial orientation and shifting back the measuring parameters of the structures of the mask obtained in the shifted position by the second correction function onto the measuring parameters of the structures obtained in the rotated orientation.

2. The method of claim 1, wherein the mask is deposited onto the measuring table by a handler of the coordinate measuring machine in the initial orientation, the rotated orientation and the shifted position.

3. The method of claim 2, wherein the handler is controlled such that the mask comes to rest on the measuring table in any orientation and/or any shifting with reference to a coordinate system of the coordinate measuring machine.

4. The method of claim 1, wherein the rotated orientation is obtained by a rotation of the mask by 90° and by the one initial orientation.

5. The method of claim 1, wherein a mirror element is provided on the measuring table, which has three supporting points for the mask and wherein the mask is deposited in a controlled manner by the handler in the orientation or shifting determined by the coordinate measuring machine onto the three supporting points of the mirror element.

6. The method of claim 1, wherein a mirror element is provided on the measuring table which has three supporting points for a mask holder, wherein the mask in the mask holder rests also on three supporting points and wherein the mask holder is deposited together with the mask, wherein said mask holder is controlled by the handler, in the orientation or shifting determined by the coordinate measuring machine on the three supporting points of the mirror element.

7. The method of claim 1, wherein the plurality of different structures to be measured and distributed on the mask are chosen in such a way that the plurality of the structures to be measured is more or less equally distributed within an effective area of the mask without the existence of a same spacing between the individual structures to be measured in X-coordinate direction and/or Y-coordinate direction.

8. The method of claim 1, wherein the coordinate measuring machine has a measurement table which is movable in a plane, and said measurement table moving the masks in a respective manner in the plane, that an illumination and imaging device is provided, wherein the imaging device has at least one objective and one detector and that the illumination device has a light source in a reflected light beam path and/or a light source in a transmitted light beam path.

* * * * *